(12) United States Patent
Ashizawa

(10) Patent No.: US 11,757,381 B2
(45) Date of Patent: *Sep. 12, 2023

(54) LENS BARREL AND IMAGING DEVICE WITH ELEMENT AND ELASTIC BODY FOR PRODUCING VIBRATION WAVE

(71) Applicant: NIKON CORPORATION, Tokyo (JP)

(72) Inventor: Takatoshi Ashizawa, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/980,762

(22) Filed: Nov. 4, 2022

(65) Prior Publication Data

US 2023/0062176 A1 Mar. 2, 2023

Related U.S. Application Data

(63) Continuation of application No. 16/753,959, filed as application No. PCT/JP2018/038629 on Oct. 17, 2018, now Pat. No. 11,522,473.

(30) Foreign Application Priority Data

Oct. 18, 2017 (JP) ................................ 2017-202118

(51) Int. Cl.
  *H02N 2/12* (2006.01)
  *H02N 2/16* (2006.01)
  *H10N 30/20* (2023.01)

(52) U.S. Cl.
  CPC ................. *H02N 2/12* (2013.01); *H02N 2/16* (2013.01); *H10N 30/20* (2023.02)

(58) Field of Classification Search
  CPC ............. H02N 2/12; H02N 2/16; H10N 30/20
  See application file for complete search history.

(56) References Cited

U.S. PATENT DOCUMENTS 11,522,473 B2 * 12/2022 Ashizawa ............. H10N 30/20
2005/0128341 A1  6/2005 Murakami
(Continued)

FOREIGN PATENT DOCUMENTS

EP    3480935 A1    5/2019
JP    H01-17354 B2  3/1989
(Continued)

OTHER PUBLICATIONS

Jan. 15, 2019 International Search Report issued in International Patent Application No. PCT/JP2018/038629.
(Continued)

*Primary Examiner* — Emily P Pham
(74) *Attorney, Agent, or Firm* — Oliff PLC

(57) ABSTRACT

A lens barrel includes an element displaced by application of voltage; an elastic body having a contact surface coming into contact with the element, a drive surface to produce a vibration wave by displacement of the element, and a plurality of grooves; a moving element come into contact with the drive surface and rotated by the vibration wave; an annular ring rotated by rotating of the moving element; and a lens moved in an optical axis direction by rotating of the annular ring; wherein the element mainly contains a material having potassium sodium niobate, potassium niobate, sodium niobate, or barium titanate, wherein a value of $[(T/B) \div W]$ is in a range of 0.84 to 1.94, where T represents a depth of the groove, B represents a distance from a bottom part of the groove to the contact surface, and W represents a radial width of the elastic body.

8 Claims, 9 Drawing Sheets

(56) References Cited

U.S. PATENT DOCUMENTS

| | | | |
|---|---|---|---|
| 2011/0280559 A1* | 11/2011 | Ashizawa | H02N 2/163 310/323.04 |
| 2012/0032557 A1 | 2/2012 | Furuta et al. | |
| 2017/0153410 A1 | 6/2017 | Hayashi et al. | |
| 2017/0155343 A1 | 6/2017 | Uebayashi et al. | |
| 2019/0044054 A1 | 2/2019 | Watanabe et al. | |
| 2019/0326835 A1 | 10/2019 | Ashizawa et al. | |

FOREIGN PATENT DOCUMENTS

| | | |
|---|---|---|
| JP | 2012-039754 A | 2/2012 |
| JP | 2016-052188 A | 4/2016 |

OTHER PUBLICATIONS

Jun. 15, 2021 Search Report issued in European Patent Application No. 18869100.0.
Mar. 17, 2022 Office Action issued in U.S. Appl. No. 16/753,959.
Aug. 4, 2022 Office Action issued in U.S. Appl. No. 16/753,959.

* cited by examiner (a)

(b)

As a time (t4-t2) is longer (that is, as a frequency change rate is smaller), a load on the vibration wave motor at activation is smaller.

LENS BARREL AND IMAGING DEVICE WITH ELEMENT AND ELASTIC BODY FOR PRODUCING VIBRATION WAVE

CLAIM OF PRIORITY

This is a Continuation of application Ser. No. 16/753,959 filed Apr. 6, 2020, which is a National Stage Application of PCT/JP2018/038629 filed Oct. 17, 2018, which in turn claims priority to Japanese Application No. 2017-202118 filed Oct. 18, 2017. The entire disclosures of the prior applications are hereby incorporated by reference herein in their entireties.

BACKGROUND

The present invention relates to a lens barrel and an imaging device.

The vibration wave motor produces a progressive vibration wave (hereinafter, abbreviated as a progressive wave) on a drive surface of an elastic body, by using the elasticity of a piezoelectric body (refer to JP H01-17354 B). A vibrator of such a vibration wave motor is generally configured with an electromechanical conversion element (hereinafter, referred to as a piezoelectric body) and an elastic body. Conventionally, a general piezoelectric body has been configured of lead zirconate titanate commonly called PZT, as an example. In recent years, in view of environmental problems, lead-free materials have been studied, and the mount thereof to the vibration wave motor has been examined.

SUMMARY

A lens barrel in one aspect of the technique to be disclosed in the present application comprises an element configured to be displaced by application of voltage; an elastic body having a contact surface coming into contact with the element, a drive surface to produce a vibration wave by displacement of the element, and a plurality of grooves; a moving element configured to come into contact with the drive surface and rotate by the vibration wave; an annular ring configured to rotate by rotating of the moving element; and a lens configured to move in a direction of an optical axis by rotating of the annular ring; wherein the element is made of a material having potassium sodium niobate, potassium niobate, sodium niobate, or barium titanate as a principal component, wherein a value of [(T/B)÷W] is in a range of 0.84 to 1.94, where T represents a depth of the groove, B represents a distance from a bottom part of the groove to the contact surface, and W represents a radial width of the elastic body.

An imaging device in another aspect of the technique to be disclosed in the present application is comprises the lens barrel and a camera body.

DETAILED DESCRIPTION OF THE EMBODIMENT

Example of Schematic Configuration of Camera

Figure 1:
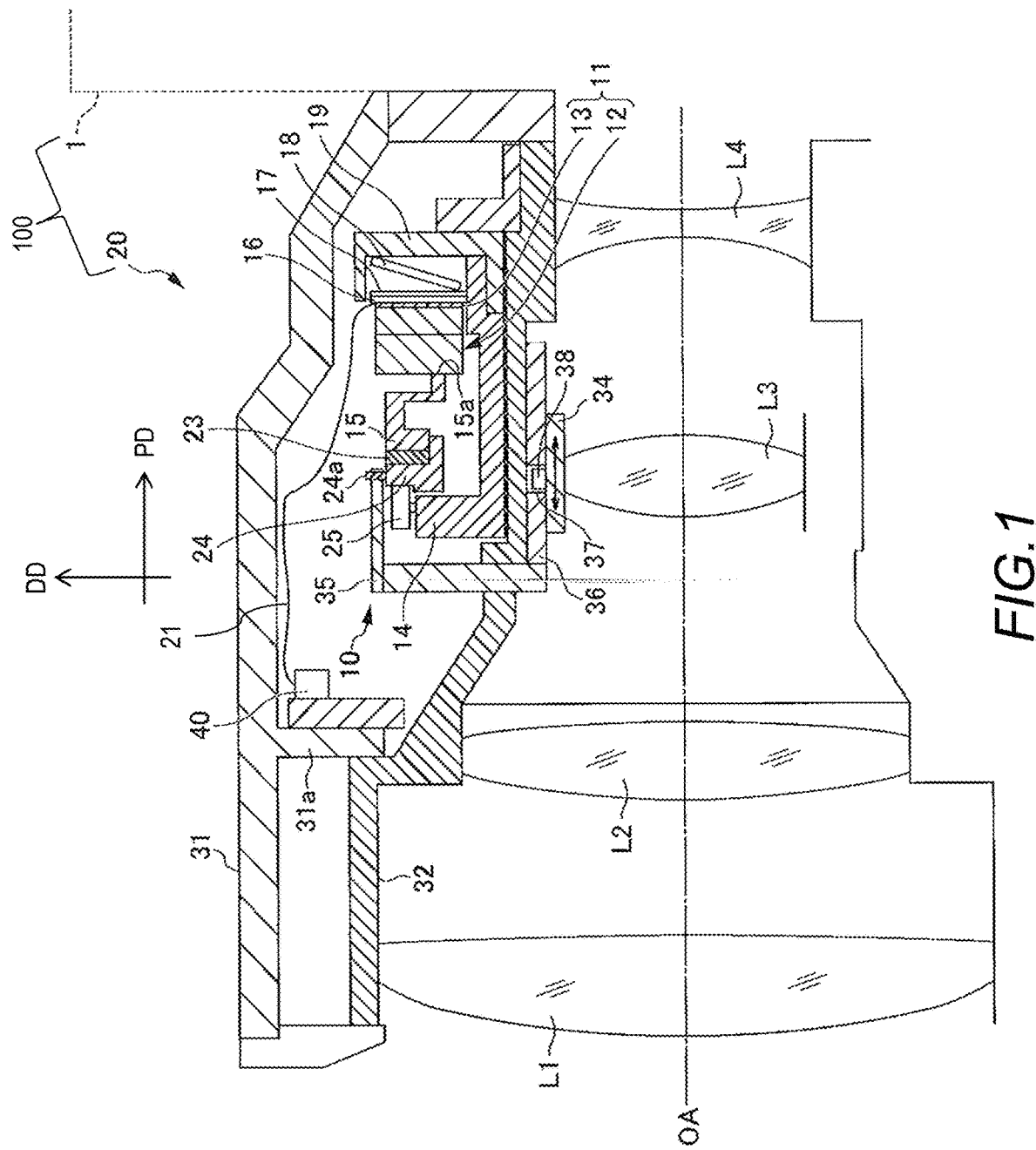
FIG. 1 is a schematic cross-sectional view of a camera having a lens barrel including a vibration wave motor.

FIG. 1 is a schematic cross-sectional view of a camera including a lens barrel including a vibration wave motor. A camera 100 is an optical device capable of capturing still images and moving images. In the camera 100, a lens barrel 20, which is an image capturing optical system, is detachably attached to a camera body 1 having an image capturing element and an image processing unit. It is noted that the camera 100 may be an integrated imaging device including the camera body 1 and the lens barrel 20.

The lens barrel 20 has an outer fixed cylinder 31, an inner fixed cylinder 32, and a vibration wave motor 10. The outer fixed cylinder 31, which has, for example, a cylindrical shape, covers the outer circumferential part of the lens barrel 20. The outer fixed cylinder 31 has a projecting piece 31a projecting from the inner circumferential surface thereof toward an optical axis OA. The projecting piece 31a supports the inner fixed cylinder 32. The inner fixed cylinder 32, which has, for example, a cylindrical shape, is disposed in the inner circumferential side of the outer fixed cylinder 31. The vibration wave motor 10 is disposed between the outer fixed cylinder 31 and the inner fixed cylinder 32.

From a subject side, a first lens unit L1, a second lens unit L2, a third lens unit L3, and a fourth lens unit L4 are disposed to the inner fixed cylinder 32 on the same optical axis OA. The third lens unit L3 is an Auto Focus (AF) lens supported by an annular AF ring 34. The first lens unit L1, the second lens unit L2 and the fourth lens unit L4 are fixed to the inner fixed cylinder 32. The third lens unit L3 is configured to move in the direction of the optical axis OA (hereinafter, optical axis direction) relative to the inner fixed cylinder 32, as the AF ring 34 moves.

The vibration wave motor 10 includes a vibrator 11, a moving element 15, a pressurizing member 18, and the like. The vibrator 11 serves as a stator, and the moving element 15 serves as a rotor which is driven rotationally.

The vibrator 11, which is an annular member, includes an elastic body 12 and a piezoelectric body 13. The elastic body 12 is joined to the piezoelectric body 13. The elastic body 12 produces a progressive wave. As one example, a nine-wave progressive wave is used as the progressive wave herein. The elastic body 12 is formed of a metallic material having large resonance sharpness. The elastic body 12 has an annular shape.

The piezoelectric body 13 is an element configured to be displaced by application of voltage, specifically, for example, an electromechanical conversion element such as a piezoelectric element or an electrostrictive element which converts electrical energy to mechanical energy. The piezoelectric body 13 is generally configured of material such as lead zirconate titanate commonly called PZT, or alternatively may be formed of other material, not limited to PZT.

The piezoelectric body 13 may also be configured of, for example, potassium sodium niobate, potassium niobate, sodium niobate, barium titanate, bismuth sodium titanate, or bismuth potassium titanate, which are lead-free materials. It is noted that the vibrator 11 will be detailed by use of FIG. 2.

In one opposite side to the side of the piezoelectric body 13 and the elastic body 12 joined to each other, a non-woven fabric 16, a pressure plate 17, the pressurizing member 18 are arranged. The non-woven fabric 16 is formed of, for example, felt. The non-woven fabric 16 is a vibration transmission preventive member configured to prevent the vibration of the vibrator 11 from being transmitted to the pressure plate 17 and the pressurizing member 18.

The pressure plate 17 is configured to receive the pressure applied by the pressurizing member 18. The pressurizing member 18 is configured with, for example, a disc spring, so as to apply pressure to the pressure plate 17. The pressurizing member 18 may be a coil spring or a wave spring, not limited to a disc spring. A pressing ring 19, which is an annular member, is fixed to a fixing member 14, and thereby retains the pressurizing member 18.

The moving element 15 is an annular member formed of light metal, for example, aluminum. The moving element 15 has, at one end thereof, a sliding surface 15a which comes into contact with the elastic body 12 and slides. The sliding surface 15a has been subjected to surface treatment such as with a sliding material so as to have higher abrasion resistance.

On the other end of the moving element 15, a vibration absorbing member 23 is arranged. The vibration absorbing member 23, which is formed of, for example, an elastic member such as rubber, absorbs the vibration in the longitudinal direction of the moving element 15. An output transfer member 24 is arranged on the opposite side to the side of the vibration absorbing member 23 contacted to the moving element 15.

The output transfer member 24 regulates displacement in a pressurizing direction PD and a radial direction DD of the moving element 15, by way of a bearing 25 disposed to the fixing member 14.

The output transfer member 24 has a projecting part 24a. The projecting part 24a is fitted in a fork 35 connected to a cam ring 36. The cam ring 36, which is an annular member, is rotated along with the rotation of the output transfer member 24.

The cam ring 36 has a key groove 37 cut obliquely (in a spiral shape) relative to the circumferential direction thereof. A fixing pin 38 is provided to the outer circumferential side of the AF ring 34. The fixing pin 38 is fitted into the key groove 37. Thus, when the cam ring 36 is driven rotationally, the AF ring 34 is moved in the advancing direction of the third lens unit L3 on the optical axis OA (the direction toward a subject, hereinafter denoted by OA+), and is then stopped at a desired position on the optical axis OA. It is noted that the backward direction of the third lens unit L3 on the optical axis OA (the direction toward the camera body 1) is denoted by "OA−".

The fixing member 14 fixes the pressing ring 19 with a screw (not shown). The pressing ring 19 is attached to the fixing member 14, thereby enabling to provide one motor unit including the output transfer member 24, the moving element 15, the vibrator 11 and the pressurizing member 18.

A drive circuit 40 is fixed to the projecting piece 31a. The drive circuit 40 performs control so that the vibration wave motor 10 is driven rotationally. The drive circuit 40 is electrically connected to the piezoelectric body 13 by a signal line 21, to supply a voltage signal to the piezoelectric body 13.

Example of Schematic Configuration of Vibrator 11 and Moving Element 15

Figure 2:
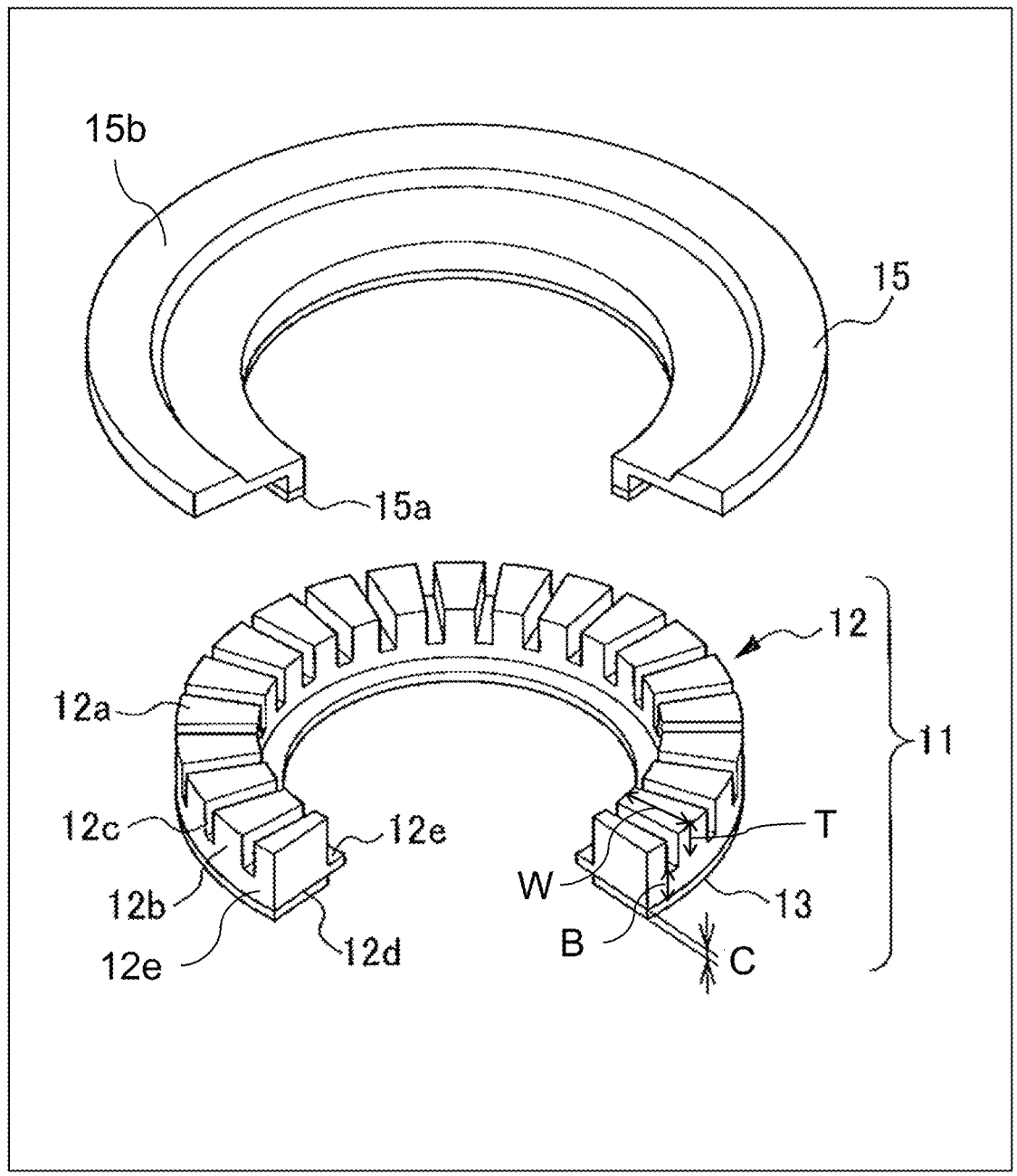
FIG. 2 is an oblique view of a vibrator and a moving element, which are partially cut off.

FIG. 2 is an oblique view of the vibrator 11 and the moving element 15, which are partially cut off. As described above, the vibrator 11 includes the elastic body 12 and the piezoelectric body 13. The elastic body 12 has a drive surface 12a in the side opposite to a joined surface 12d joined to the piezoelectric body 13. The drive surface 12a has been subjected to surface treatment with lubricant.

The drive surface 12a is brought into pressurized contact with the sliding surface 15a of the moving element 15, and makes the moving element 15 driven rotationally. The drive surface 12a has a groove 12c. The elastic body 12 has a plurality of projecting parts 12b so as to interpose the grooves 12c. In other words, each of the grooves 12c is formed between adjacent projecting parts 12b. The top surfaces of the projecting parts 12b serve as the drive surfaces 12a.

The vibration wave motor 10 drives the third lens unit L3, by driving the moving element 15, using the drive force generated on the drive surfaces 12a by the excitation of the piezoelectric body 13. The reason for forming the grooves 12c in the elastic body 12 is to bring a neutral plane 800 of the progressive wave in the width of the vibrator 11 in the optical axis direction, as close as possible to the piezoelectric body 13, thereby amplifying the amplitude of the progressive wave on the drive surfaces 12a.

In the elastic body 12, the portion excluding the projecting parts 12b out of the portions including over from the joined surface 12d joined to the piezoelectric body 13 to the drive surfaces 12a to be brought into pressurized contact with the sliding surface 15a of the moving element 15 is referred to as a base part 12e. That is, the elastic body 12 is configured to have a comb-teeth shape, with the base part 12e and the projecting parts 12b arranged in the circumferential direction on the base part 12e, and further the grooves 12c formed between adjacent projecting parts 12b.

It is noted that B represents the thickness of the base part 12e. C represents the thickness of the piezoelectric body 13 in the optical axis direction. T represents the depth of the grooves 12c formed between adjacent projecting parts 12b, in other words, the length of the projecting parts 12b in the optical axis direction. W represents the width in the radial direction DD of the elastic body 12.

The moving element 15 has the sliding surface 15a to be brought into pressurized contact with the drive surfaces 12a. The moving element 15 further has a joined surface 15b to be joined to the output transfer member 24, on the opposite side to the sliding surface 15a of the moving element 15.

Piezoelectric Body 13

Figure 3:
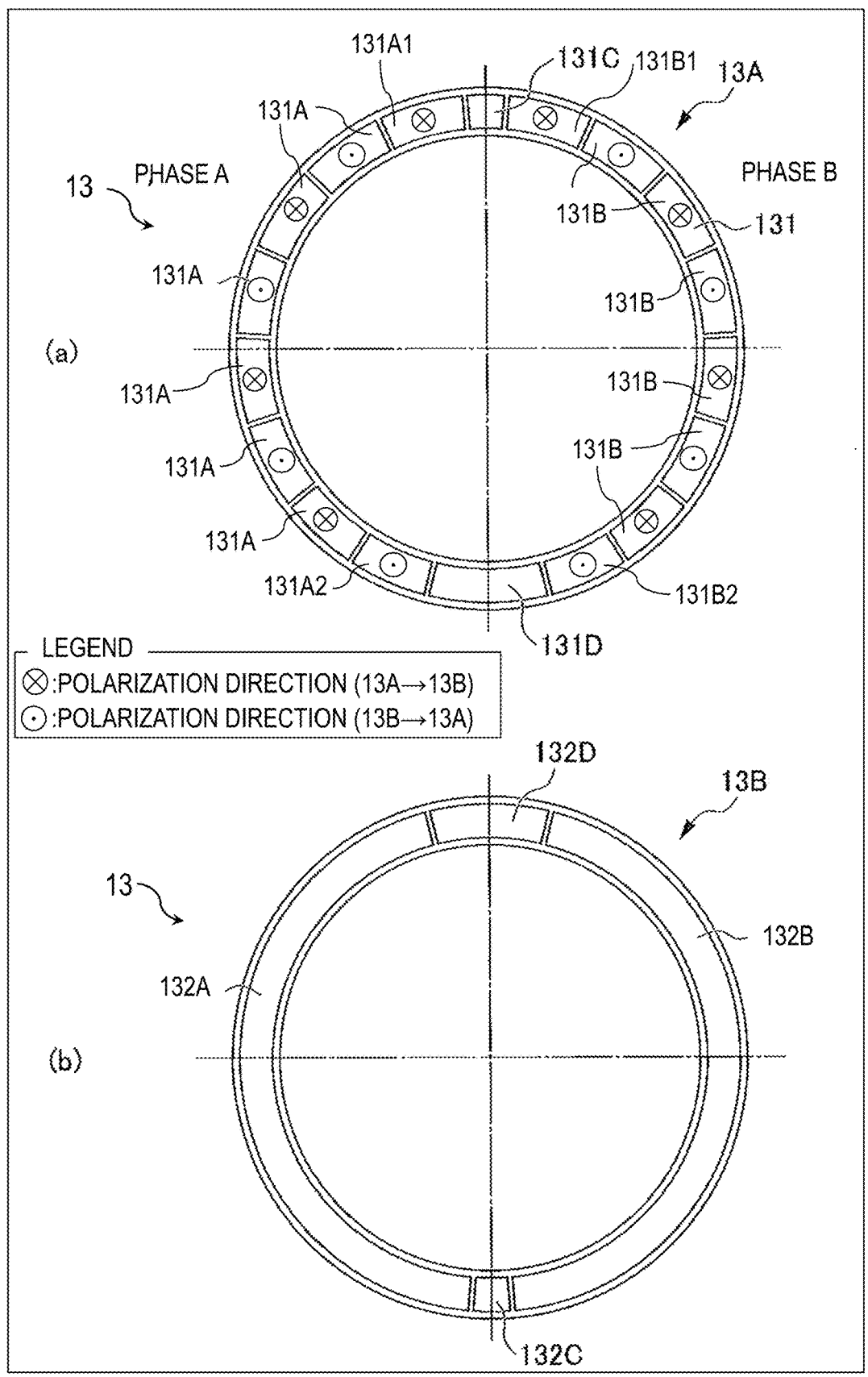
FIG. 3 is an explanatory view illustrating a piezoelectric body.

FIG. 3 is an explanatory view illustrating the piezoelectric body 13. (a) illustrates an annular first surface 13A to be joined to the joined surface 12d of the elastic body 12, and (b) illustrates an annular second surface 13B which is the back face of the first surface 13A of the elastic body 12, and is brought into contact with the non-woven fabric 16.

The piezoelectric body 13 is divided into two phases (a phase A and a phase B) along the circumferential direction. In each phase, elements are arranged so that the poles thereof are alternately arranged every ½ wavelength of the progressive wave, and an interval of ¼ wavelength is provided between the phase A and the phase B.

In (a), the first surface 13A has, on the phase A, a plurality (eight in the present example) of first electrodes 131A are arranged along the circumferential direction of the first surface 13A, and has, on the phase B, a plurality (eight in the present example) of second electrodes 131B are arranged along the circumferential direction of the first surface 13A. In particular, the first electrode 131A disposed at one end out of the plurality of first electrodes 131A is denoted by a first electrode 131A1, and the first electrode 131A disposed at the other end is denoted by a first electrode 131A2. Similarly, the second electrode 131B disposed at one end out of the plurality of second electrodes 131B is denoted by a second electrode 131B1, and the second electrode 131B disposed at the other end is denoted by a second electrode 131B2.

The first surface 13A has a third electrode 131C having ¼ wavelength of the progressive wave, between the first electrode 131A1 and the second electrode 131B1, and has a fourth electrode 131D having ¾ wavelength of the progressive wave, between the first electrode 131A2 and the second electrode 131B2. These electrodes 131A, 131B, 131C, 131D are polarized into plus poles (+) and minus poles (−), respectively and alternately in adjacent electrodes 131A, 131B, 131C, 131D along the circumferential direction.

In (b), the second surface 13B has a first electrode 132A on the back-face side of the phase A, and a second electrode 132B on the back-face side of the phase B. The second surface 13B has a third electrode 132C having ¼ wavelength of the progressive wave on the back-face side of the third electrode 131C having ¼ wavelength of the progressive wave, and a fourth electrode 132D having ¾ wavelength of the progressive wave, on the back-face side of the fourth electrode 131D having ¾ wavelength of the progressive wave.

When a drive voltage is applied to the first electrode 132A, the drive voltage is transmitted to the phase A. When the drive voltage is applied to the second electrode 132B, the drive voltage is transmitted to the phase B. The third electrode 132C having ¼ wavelength of the progressive wave is short circuited to the elastic body 12 by way of conductive coating material, and grounded (GND).

Configuration Example of Blocks of Drive Circuit 40

Figure 4:
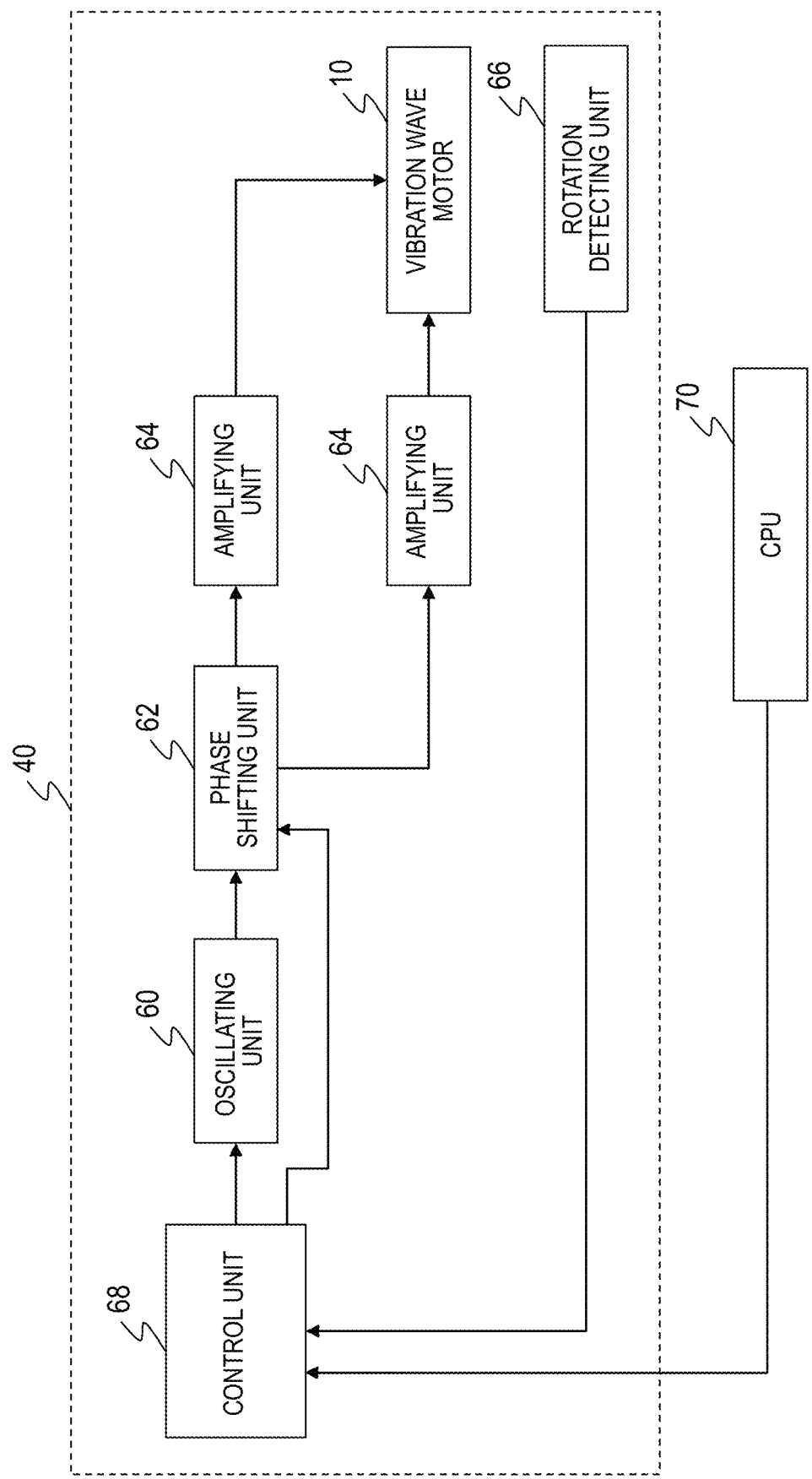
FIG. 4 is an explanatory view illustrating a configuration example of blocks of a drive circuit.

FIG. 4 is an explanatory view illustrating a configuration example of blocks in the drive circuit 40. The drive circuit 40 provides a drive signal that fluctuates repeatedly to the vibration wave motor 10. The drive circuit 40 has an oscillating unit 60, a phase shifting unit 62, two amplifying units 64, the vibration wave motor 10, a rotation detecting unit 66, and a control unit 68.

The oscillating unit 60 generates a drive signal having a desired frequency in response to the command issued by the control unit 68, and outputs it to the phase shifting unit 62. The phase shifting unit 62 divides the drive signal generated by the oscillating unit 60 into two drive signals having phases differing from each other. Each amplifying unit 64 boosts the two drive signals divided by the phase shifting unit 62, respectively to desired voltages. The drive signals from the amplifying unit 64 are transmitted to the vibration wave motor 10. The application of the drive signals makes the vibrator 11 produce a progressive wave, whereby the moving element 15 is driven.

The rotation detecting unit 66, which is configured with, for example, an optical encoder or a magnetic encoder, detects the position and speed of the cam ring 36 driven by the driving of the moving element 15, and transmits the detected value (detected position and detected speed) to the control unit 68 as an electrical signal (detection signal).

The control unit 68 controls the driving of the vibration wave motor 10, on the basis of the drive command issued by a processor 70 disposed inside the lens barrel 20 or in the camera body 1. The control unit 68 receives the detection signal from the rotation detecting unit 66, and calculates information indicating a target position and a moving speed of the cam ring 36, on the basis of the detection value.

The control unit 68 then controls the frequency of the oscillation signal to be output by the oscillating unit 60, so as to position the cam ring 36 to the target position described above. The control unit 68 changes the phase difference of the phase shifting unit 62 to 90 degrees or minus 90 degrees, when switching the rotational direction of the cam ring 36 to normal rotation or reverse rotation.

Operation Example of Vibration Wave Motor 10

The operation of the vibration wave motor 10 of the embodiment is described next. When the control unit 68 issues a drive command, the oscillating unit 60 generates a drive signal, and outputs it to the phase shifting unit 62. The drive signal is divided by the phase shifting unit 62 into two drive signals having phases differing by 90 degrees from each other, and the drive signals are amplified up to desired voltages by each amplifying unit 64.

The amplified drive signals are applied to the piezoelectric body 13 of the vibration wave motor 10, and thereby the piezoelectric body 13 is excited. The excitation produces 9-peak bending vibration in the elastic body 12. The piezoelectric body 13 is divided into the phase A and the phase B, and the drive signals are applied to the phase A and the phase B, respectively. The 9-peak bending vibration generated in the phase A and the 9-peak bending vibration generated in the phase B respectively have phases positionally displaced by ¼ wavelength from each other, and the drive signal applied to the phase A and the drive signal applied to the phase B respectively have phases differing by 90 degrees from each other. Thus, the two bending vibrations are synthesized to form a 9-wave progressive wave.

Elliptic motion occurs at the crests of the progressive wave. Therefore, the moving element 15 in pressurized contact with the drive surfaces 12a is driven by the friction due to the elliptic motion. The rotation detecting unit 66 is arranged to the cam ring 36 to be driven by the driving of the moving element 15, and an electrical pulse generated therefrom is transmitted to the control unit 68 as a detection signal. The control unit 68 is able to acquire the current position and the current speed of the cam ring 36, on the basis of the detection signal.

Taking into consideration environmental problems, a lead-free material is used as the piezoelectric body 13 in the vibration wave motor 10 described above. However, as a result of intensive examinations by the present inventors, it has been found that the vibration wave motor 10 equipped with the lead-free piezoelectric body 13 hardly provides the level of the driving performance similar to the level of the piezoelectric body of PZT (lead zirconate titanate) under the same conditions.

Through the examinations of the factor by CAE (computer aided engineering) analysis and the like, it has been found that the lead-free piezoelectric body 13 and PZT are different in density. In an example, the lead-free piezoelectric body 13 has a density of 4.2 to $4.7 \times 10^3$ [kg/m$^3$] in the case of a niobium-based material, and a density of 5.5 to $6.0 \times 10^3$ kg/m$^3$ in the case of a barium titanate-based material.

In contrast, PZT has a density of 7.7 to $7.8 \times 10^3$ [kg/m$^3$]. That is, the lead-free piezoelectric body 13 has a smaller density by more than 20 percent to more than 40 percent, as compared with PZT. It has been found that this prevents the vibrator 11 configured by joining the lead-free piezoelectric body 13 and the elastic body 12, from exhibiting vibration performance.

Equivalent Circuit

Figure 5:
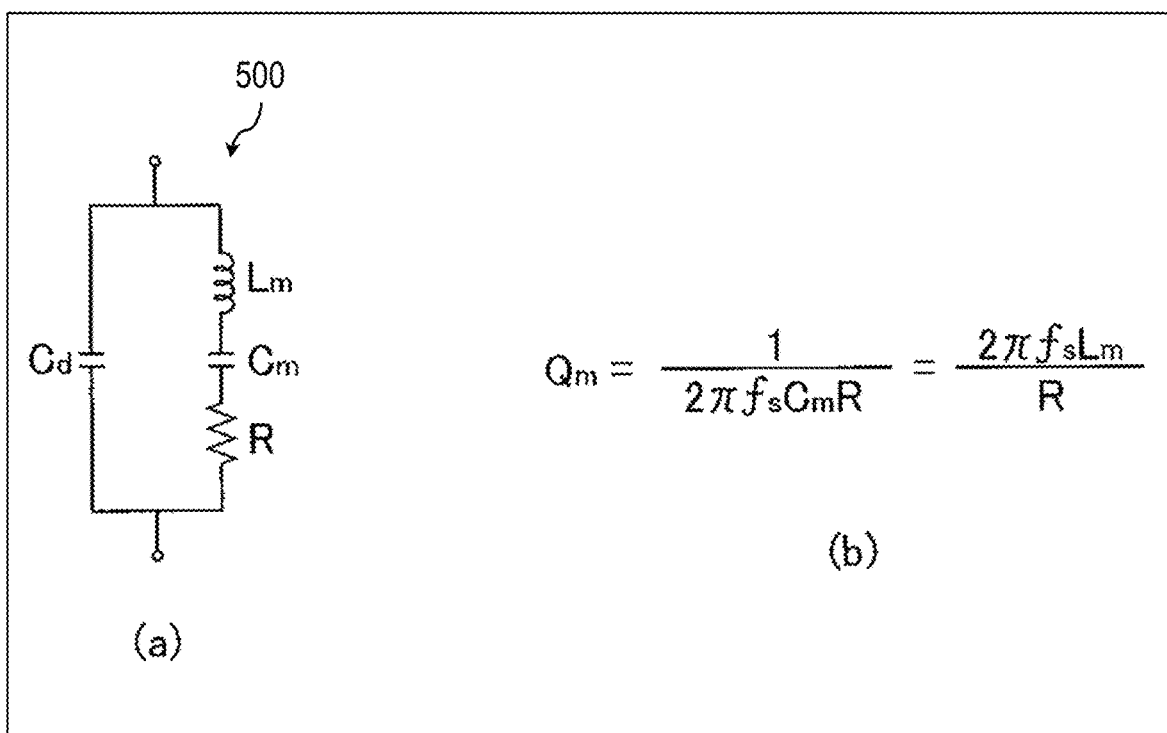
FIG. 5 is an explanatory view illustrating an equivalent circuit of the vibrator of the vibration wave motor.

FIG. 5 is an explanatory view illustrating an equivalent circuit of the vibrator 11 of the vibration wave motor 10. (a) illustrates the equivalent circuit, and (b) indicates the formula of a mechanical quality factor Qm. In (a), Lm represents an equivalent inductance, Cm represents an equivalent capacitance, R represents a resonance resistance, and Cd represents a capacitance of the piezoelectric body 13. The values of Lm and Cm affect the resonance characteristics of the vibrator 11. The mechanical quality factor Qm in (b) is a measure of the resonance characteristics. As the value of Qm is larger, the resonance characteristics are better. As the value of Lm is larger, the mechanical quality factor Qm is larger.

Table 1 below indicates the values of Lm and the values of Cm calculated by the CAE analysis, in terms of respective types of material used in the piezoelectric bodies 13. The models of the piezoelectric bodies 13 have been configured as follows.

Outer diameter: 62 [mm]
Inner diameter: 55 [mm]
Thickness of the vibrator 11: 4.22 [mm]
Number of the grooves 12c provided in the side of the drive surfaces 12a: 48
Depth of the grooves 12c: 1.92 [mm]

TABLE 1

|  | Density | Factor value of equivalent circuit | |
|---|---|---|---|
|  | $10^3$ [kg/m$^3$] | Lm [H] | Cm [nF] |
| PZT | 7.7 | 0.341 | 0.064 |
| Barium titanate based | 6.0 | 0.325 | 0.065 |
| Niobium based | 4.2 | 0.313 | 0.066 |

As shown in Table 1, the value of Lm of PZT is 0.341, whereas the value of Lm of a barium titanate-based material is 0.325, and the value of Lm of a niobate-based material is 0.313. That is, as the density is smaller, the value of Lm is smaller. The value of Lm of the case where the lead-free piezoelectric body 13 is incorporated in the vibrator 11 is smaller than the value of the case where the piezoelectric body 13 of PZT is incorporated.

That is, the mechanical quality factor Qm of the case where the lead-free piezoelectric body 13 is incorporated is smaller than the value of the case where the piezoelectric body of PZT is incorporated. It has been found that desired resonance characteristics are hardly exhibited in the case where the lead-free piezoelectric body 13 is incorporated, as compared to the case where the piezoelectric body 13 of PZT is incorporated.

The vibration wave motor 10 utilizes resonance in principle, and thus in the case where the vibrator 11 is not able to exhibit desired vibration characteristics, the vibration wave motor 10 hardly exhibits driving performance in the state where the moving element 15 is combined. Accordingly, the vibrator 11 with the lead-free piezoelectric body 13 incorporated less likely exhibits desired driving performance.

In order to improve the resonance characteristics of the vibrator 11 with the lead-free piezoelectric body 13 incorporated, the tendency with respect to the dimensions of the vibrator 11 deriving a higher value of Lm has been examined. Herein, T represents a depth of the grooves 12c formed between adjacent projecting parts 12b of the elastic body 12, B represents a thickness of the base part 12e from the bottom part of the grooves 12c to the joined surface 12d joined to the piezoelectric body 13, W represents a width of the elastic body 12 in the radial direction DD, and λ represents a wavelength of the progressive wave produced in the vibrator 11.

Example of Results by CAE Analysis

Figure 6:
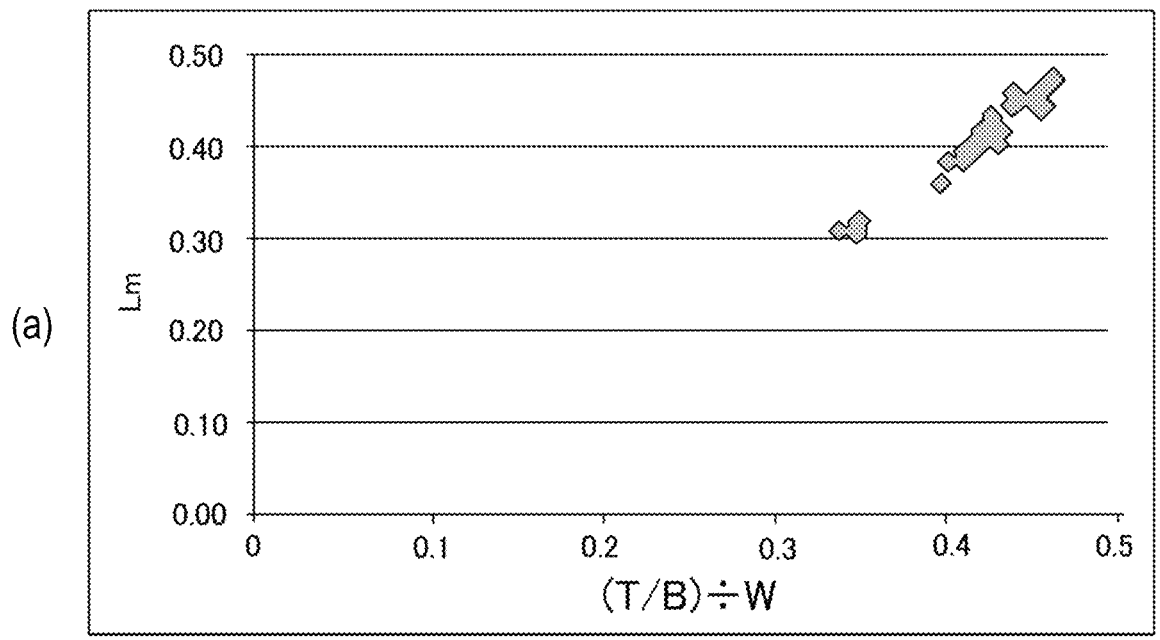
FIG. 6 is a graph indicating results by CAE analysis.
Figure 6:
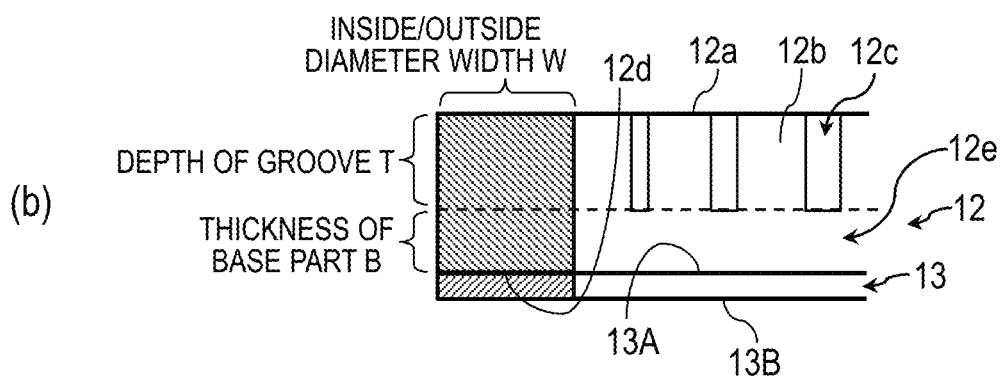

FIG. 6 is a graph indicating the results by the CAE analysis. (a) is the graph indicating the results by the CAE analysis, and (b) illustrates the dimensions of the vibrator 11. Specifically, FIG. 6 indicates the resultant values of Lm calculated by the CAE analysis by changing respective values in the following example ranges of:

Value of T: 1.9 to 2.8;
Value of B: 1.0 to 1.9; and
Value of W: 2.4 to 4.5.

The calculation results reveal that the values of [(T/B)÷W] and the values of Lm are related to each other. Specifically, in an example, the value of Lm is larger as the value of T is larger; is larger as the value of B is smaller; tends to be larger as the value of W is smaller; and tends to be larger as the value of λ is larger.

The CAE analysis has been performed to check the values of Lm of the vibrator 11 in terms of the respective types of material of the piezoelectric body 13, including the niobium-based material (4.2 to 4.7×$10^3$ [kg/m$^3$]) having a smaller density than PZT, of the case where various values of [(T/B)÷W] are set. Table 2 indicates the calculation results thereof.

TABLE 2

|  | Density | (T/B) ÷ W | | | |
|---|---|---|---|---|---|
|  | $10^3$ [kg/m$^3$] | 0.51 | 0.84 | 1.02 | 1.94 |
| PZT | 7.7 | 0.533 | | | |
| Niobium based | 4.7 | 0.491 | 0.647 | 0.766 | 1.378 |
|  | 4.2 | 0.485 | 0.639 | 0.757 | 1.361 |

It is noted that Table 2 indicates the resultant values of Lm of the case where the values of [(T/B)÷W] are set to 0.51, 0.84, 1.02, 1.94, by changing respective values in the following ranges of:

Value of T: 1.9 to 3.5;
Value of B: 1.0 to 2.9; and
Value of W: 2.4 to 4.5.

Since the range of 4.2 to 4.7×$10^3$ [kg/m$^3$] corresponds to the range of the density of a general niobium-based piezoelectric material, the CAE analysis has been performed in terms of the upper limit density value and the lower limit density value.

Table 2 reveals that the value of Lm is smaller as the density is smaller, and is larger than the value of the vibrator 11 with PZT incorporated as the value of [(T/B)÷W] is larger. Taking into consideration possible harmful effects of the case of a larger value of [(T/B)÷W], the inventors have experimentally produced the vibration by using a niobium-based material, to examine the resonance characteristics as the vibration wave motor 10.

Potassium sodium niobate is used as the main component of the piezoelectric body 13, and the elastic body 12 is formed of stainless steel. Twelve types of the vibrators 11 have been experimentally produced, with the elastic body 12 having different values of T and values of B and different widths W in the radial direction DD, and have been examined in terms of the voltages (drive voltages) of the drive signals respectively allowing the twelve trial products of the vibrators 11 to be driven.

The trial products have been produced so as to have respective values in the following ranges of:
Value of T: 1.5 to 2.0;
Value of B: 0.35 to 0.75; and
Value of W: 2.4 to 2.7.

The piezoelectric bodies 13 of the trial products have the density of $4.4 \times 10^3$ [kg/m$^3$].

Figure 7:
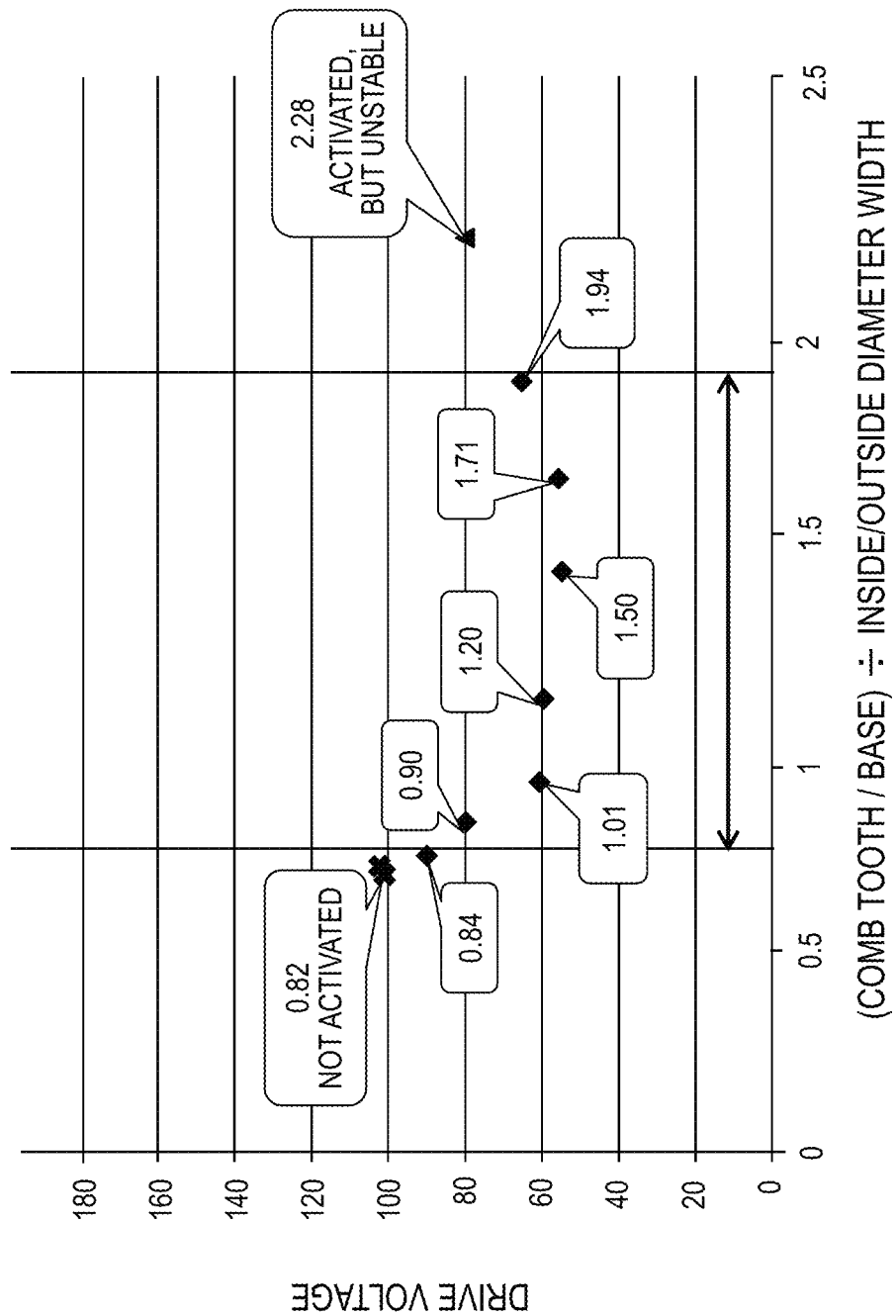
FIG. 7 is a graph indicating measurement results of values of [(T/B)÷W] according to drive voltages.

As the voltage of the drive signal allowing driving is lower, the resonance characteristics in the actual machine of the vibration wave motor 10 are considered to be better. As the voltage of the drive signal is higher, the resonance characteristics in the actual machine of the vibration wave motor 10 are considered not to be better. FIG. 7 indicates the measurement results.

Example of Measurement Results of Values of [(T/B)÷W]

FIG. 7 is a graph indicating the measurement results of values of [(T/B)÷W] according to drive voltages. In the case where the value of [(T/B)÷W] is 0.82, the vibration wave motor 10 has not been started even with the drive voltage of 100 [V] applied.

It has been found that, in the case where the value of [(T/B)÷W] is in the range of 0.84 to 1.94, the vibration wave motor 10 is able to be started with an appropriate drive voltage of 100 [V] or lower applied.

In the case where the value of [(T/B)÷W] is 2.29, the vibration wave motor 10 has been just driven with the moving element 15 rotating in a somewhat unstable state.

As described above, as the value of [(T/B)÷W] is larger, the value of Lm of the vibrator 11 is larger, and thus the value of Qm is improved. On the other hand, an electromechanical coupling coefficient Kvn of the vibrator 11 may be smaller in some cases, and the conversion efficiency from electrical energy into mechanical energy may be deteriorated as a harmful effect.

In the case where the value of [(T/B)÷W] is 2.29, it is considered that such a harmful effect has occurred and thereby the moving element 15 has been rotated in a somewhat unstable state. On the basis of the results of the examinations described above, the vibration wave motor 10 of Example 1 is configured as follow.

EXAMPLE 1

The piezoelectric body 13 contains potassium sodium niobate. Specifically, the piezoelectric body 13 contains, for example, potassium sodium niobate as the main component (e.g., 90%), and material such as lithium and/or antimony as the rest component. The piezoelectric body 13 has a density of 4.2 to $4.7 \times 10^3$ [kg/m$^3$].

The elastic body 12 is formed of stainless steel, and the value of [(T/B)÷W] is in the range of 0.84 to 1.94. Such a configuration allows to ensure the resonance characteristics as the vibrator 11, even when the piezoelectric body 13 has a smaller density than the density of the case with PZT used as the main component, and allows to ensure the driving performance in the state where the moving element 15 is combined.

Specifically, in the case where the value of [(T/B)÷W] is 0.84 as an example, the value of Lm of the vibrator 11 is approx. 0.65 according to the calculation results by the CAE analysis, and in the case where the value of [(T/B)÷W] is 1.94, the value of Lm of the vibrator 11 is approx. 1.4.

The value of [(T/B)÷W] is set in the range of 0.84 to 1.94 in the example described above, or alternatively is set preferably in the range of 0.90 to 1.94 in view of further lowering the drive voltage, more preferably to the range of 1.01 to 1.94, or further more preferably to the range of 1.01 to 1.71.

EXAMPLE 2

Example 2 is different from Example 1 in that the piezoelectric body 13 includes different material. Specifically, the piezoelectric body 13 contains, for example, barium titanate as the main component, and has a density of 5.5 to $6.0 \times 10^3$ [kg/m$^3$]. The elastic body 12 is formed of stainless steel, and the value of [(T/B)÷W] is set in the range of 0.84 to 1.94.

As shown in Table 1, in the case where the piezoelectric body 13 contains barium titanate, the piezoelectric body 13 has a smaller density than the density of the case with PZT as the main component thereof, and thus the value of Lm of the vibrator 11 is smaller, resulting in that insufficient resonance characteristics are exhibited as the vibrator 11. Even if the moving element 15 is combined under such conditions, the driving performance is not able to be exhibited.

Therefore, in Example 2, the value of [(T/B)÷W] is set variously, the value of Lm of the vibrator 11 has been calculated by the CAE analysis. Table 3 indicates the calculation results.

TABLE 3

| | Density | (T/B) ÷ W | | | |
|---|---|---|---|---|---|
| | $10^3$ [kg/m$^3$] | 0.51 | 0.84 | 1.02 | 1.94 |
| PZT | 7.7 | 0.533 | | | |
| Barium titanate based | 6.0 | 0.506 | 0.663 | 0.786 | 1.413 |
| | 5.5 | 0.499 | 0.654 | 0.775 | 1.393 |

Table 3 indicates the calculation results of the values of Lm of the vibrator 11 of the cases where the value of [(T/B)÷W] is variously set to 0.51, 0.84, 1.2, 1.94, and where the piezoelectric body 13 has the densities of $5.5 \times 10^3$ [kg/m$^3$] and $6.0 \times 10^3$ [kg/m$^3$].

Since the range of 5.5 to $6.0 \times 10^3$ [kg/m$^3$] of the density of the piezoelectric body 13 corresponds to the range of the density of a general barium titanate-based piezoelectric material, the CAE analysis has been performed in terms of the upper limit density value and the lower limit density value. It is noted that the CAE analysis has been performed in the following ranges of:
Value of T: 1.9 to 3.5;
Value of B: 1.0 to 2.9; and
Value of W: 2.4 to 4.5.

It is noted that a wavelength λ of the progressive wave produced in the vibrator 11 is set as λ=20.4.

In the case where the piezoelectric body 13 contains barium titanate, the value of Lm is approx. 0.65 when the value of [(T/B)÷W] is 0.84, and the value of Lm of the vibrator 11 is approx. 1.4 when the value of [(T/B)÷W] is 1.94. With respect to the relation between the value of [(T/B)÷W] and the value of Lm, the values of the barium titanate-based material of the piezoelectric body 13 having a density of 5.5 to $6.0 \times 10^3$ [kg/m$^3$] are substantially equal to the values of niobate-based material (refer to Table 2) of the piezoelectric body 13 having a density of 4.2 to $4.7 \times 10^3$ [kg/m$^3$]. Accordingly, the range of 0.84 to 1.94 is considered appropriate as the value of [(T/B)÷W].

The value of Lm of the niobate-based material of the piezoelectric body 13 indicated in Table 2 (density: 4.2 to 4.7×10³ [kg/m³]) and the value of Lm of the barium titanate-based material of the piezoelectric body 13 indicated in Table 3 (density: 5.5 to 6.0×10³ [kg/m³]) are in similar relation in the range of 0.84 to 1.94 of the value of [(T/B)÷W]. Accordingly, in the range of 4.2 to 6.0×10³ [kg/m³] of a density of the piezoelectric body 13, the range of 0.84 to 1.94 is considered appropriate as the value of [(T/B)÷W].

The value of [(T/B)÷W] is set in the range of 0.84 to 1.94 in the example described above, or alternatively is set preferably to the range of 0.90 to 1.94 in view of further lowering the drive voltage, more preferably to the range of 1.01 to 1.94, or further more preferably to the range of 1.01 to 1.71.

EXAMPLE 3

Example 3 is described. In the description of Examples 1 and 2, the range of the value of [(T/B)÷W] is set so that the value of Lm of the equivalent circuit of the case where the lead-free piezoelectric body 13 is incorporated is larger. The value tends to be larger than the case with PZT incorporated as the piezoelectric body 13.

There are following two methods to set a larger value of [(T/B)÷W]:
(1) by setting a larger value as T/B; and
(2) by setting a smaller value as W. Even by either of the two methods, the vibration wave motor 10 may not be driven in the case where the speed is largely changed, such as when the vibration wave motor 10 is started, or in other case. The factor is described by referring to FIG. 8.

Example of Behavior of Projecting Parts 12b

Figure 8:
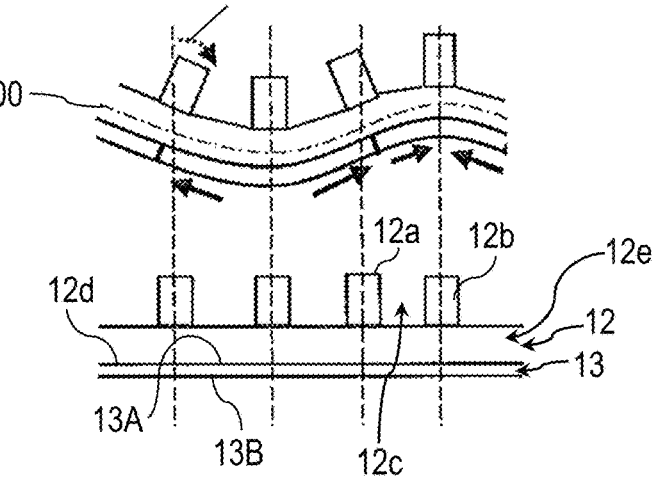
FIG. 8 is an explanatory view illustrating projecting parts of the vibrator in terms of the behavior thereof by a vibration wave.
Figure 8:
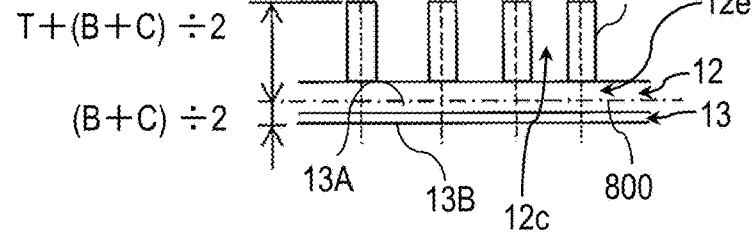
Figure 8:
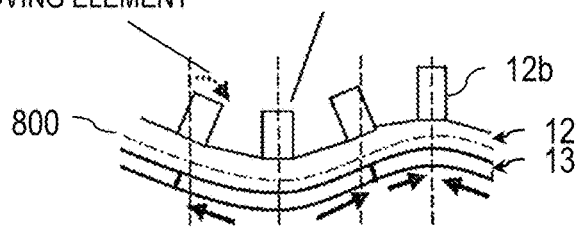

FIG. 8 is an explanatory view illustrating the projecting parts 12b of the vibrator 11 in terms of the behavior thereof by a vibration wave. (a) illustrates the projecting parts 12b of the vibrator 11 in terms of the behavior thereof by a vibration wave of the case where the value of T/B is smaller than the value in (b) (the grooves 12c have shallower depth). (b) illustrates the projecting parts 12b of the vibrator 11 in terms of the behavior thereof by a vibration wave of the case where the value of T/B is larger than the value in (a) (the grooves 12c have deeper depth). (c) illustrates the projecting parts 12b of the vibrator 11 in terms of the behavior thereof by a vibration wave of the case where the value of W is smaller than the value in (a).

(1) By Setting a Larger Value as T/B

In the case where a progressive wave is produced in the vibrator 11, deformation occurs at the portion where the thickness of the base part 12e and the thickness of the piezoelectric body 13 are joined (i.e., the elastic body 12 of the state without any projecting part 12b is bent and deformed).

The neutral plane 800 of the bent elastic body 12 exists between the groove bottoms of the grooves 12c of the elastic body 12 and the joined surface 12d. The projecting parts 12b fluctuate in the driving direction (the circumferential direction of the elastic body 12) due to the bending vibration generated at the portion where the thickness B of the base part 12e and the thickness C of the piezoelectric body 13 are joined.

In the case where the value of T/B is small as illustrated in (a), the motion in the driving direction of each of the tip surfaces (drive surfaces 12a) of the projecting parts 12b is small. In the case where the value of T/B is large as illustrated in (b), the motion in the driving direction is large. The speed of the motion herein is to be estimated roughly. The motion in the driving direction of the moving element 15 occurring at the portion where the thickness B of the base part 12e and the thickness C of the piezoelectric body 13 are joined is set as ((B+C)/2).

The expression of ((B+C)/2) corresponds to the half of the distance obtained by adding the thickness B of the base part 12e and the thickness C of the piezoelectric body 13, that is, the distance from the second surface 13B joined to the non-woven fabric 16 of the piezoelectric body 13 to the neutral plane 800. In this case, the motion in the driving direction generated on the drive surfaces 12a is the value of (T+(B+C)/2)/((B+C)/2) times the motion of the moving element 15. In an example, as a larger value is set as T, the drive surfaces 12a fluctuate largely correspondingly.

The thickness C of the piezoelectric body 13 is several times smaller than the thickness B of the base part 12e, and thus the above formula (T+(B+C)/2)/((B+C)/2) approximates to (T+B/2)/(B/2).

In the case where the value of T/B is large, the motion in the driving direction is large, and thus the force applied from the moving element 15 to the drive surfaces 12a increases. In an example, when the displacement of the motion of the elastic body 12 in the driving direction is doubled, the speed and acceleration of the moving element 15 are also doubled. In the case where the moving element 15 in contact with the drive surfaces 12a is to be driven, twice the force (load) is applied to the drive surfaces 12a. This may hinder the vibration wave motor 10 from being driven, in the case where the change in speed is large such as when the vibration wave motor 10 is started, or in other case.

(2) By Setting a Smaller Value as W

As described above, the projecting parts 12b during when the progressive wave is produced in the vibrator 11 fluctuate in the driving direction (the circumferential direction of the elastic body 12) due to the bending vibration generated at the portion where the thickness B of the base part 12e and the thickness C of the piezoelectric body 13 are joined.

In the case where the inside/outside diameter width W is small, that is, the case where the inside/outside diameter width W is narrow, the mass of the projecting parts 12b of the vibrator 11 is small, as compared with the case where the value W is wide. Accordingly, since the mass is small, the inertial force of the projecting parts 12b in the driving direction is smaller, and the resistance force generated against the force in the driving direction applied from the moving element 15 to the drive surfaces 12a is applied in a smaller area.

In an example, ½ times the inside/outside diameter width W leads to ½ times the mass of the projecting parts 12b. In the case where the moving element 15 in contact with the drive surfaces 12a is to be driven, the resistance force generated against the force (load) from the drive surfaces 12a is applied in ½ times the area. This may hinder the vibration wave motor 10 from being driven, in the case where the change in speed is large such as when the vibration wave motor 10 is started, or in other case.

According to the consideration described above, in at least one of (1) a case of setting a large value as T/B or (2) a case of setting a small value as W, a large force is applied from the moving element 15 to the drive surfaces 12a in the case where the change in speed is large such as when the vibration wave motor 10 is started, or in other case.

In other words, as the value of [(T/B)÷W] is larger, a larger force is applied from the moving element 15 to the drive surfaces 12a in the case where the change in speed is large such as when the vibration wave motor 10 is started, or in other case, and the vibration wave motor 10 is less likely to be started.

According to the consideration described above, the case (1) where the value of T/B is larger, the force applied from the moving element 15 to the drive surfaces 12a is larger substantially in proportion to the value. On the other hand, the case (2) where the value of W is smaller, the force applied from the moving element 15 to the drive surfaces 12a is larger substantially in inverse proportion to the value. On the basis of the consideration results, the method of starting the vibration wave motor 10 has been examined.

Example of Driving Sequence of Vibration Wave Motor 10

Figure 9:
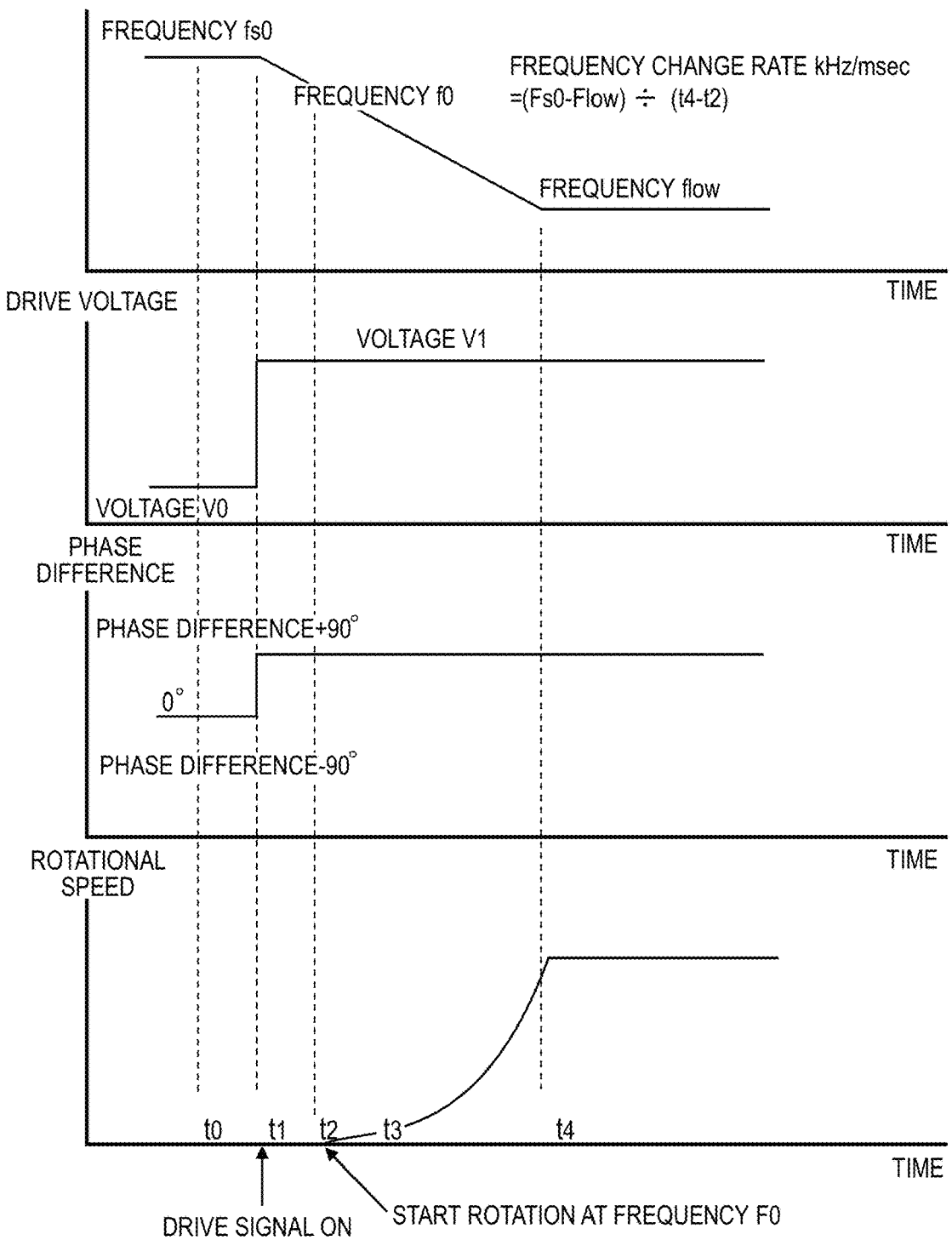
FIG. 9 is an explanatory view indicating an example of driving sequence of the vibration wave motor.

FIG. 9 is an explanatory view indicating an example of driving sequence of the vibration wave motor 10. FIG. 9 indicates the temporal change in the drive frequency of the vibration wave motor 10, the temporal change in the drive voltage of the vibration wave motor 10, the temporal change in the phase difference between two drive signals, and the temporal change in the rotational speed of the vibration wave motor 10.

In the state (t0) where there is no drive command from the control unit 68, the setting is as follows:

Drive frequency: fs0

Drive voltage: voltage V0 (=0 [V])

Phase difference between the phase A and the phase B: 0 degree

When a drive command is received from the control unit 68 (t1), the setting is as follows:

Drive frequency: fs0

Drive voltage: voltage V1

Phase difference between the phase A and the phase B: 90 degrees (−90 degrees at inverse driving). At this time, the rotational speed is 0 (rotational speed 0).

The drive frequency is gradually lowered, and when the drive frequency reaches a frequency f0 at a time t2, the moving element 15 is driven rotationally.

The frequency reaches "flow" at a time t4, and the rotational speed reaches a target speed Rev1.

In Example 3, the time relative to the change in frequency during when the frequency is swept is extended according to the value of [(T/B)÷W]. Specifically, for example, the difference in frequency of "flow−fs0" is correlated to the difference in time (hereinafter, rise time) of "t4−t2".

In the case where the value of [(T/B)÷W] is small, the rise time (t4−t2) is to be shortened.

In the case where the value of [(T/B)÷W] is large, the rise time (t4−t2) is to be extended.

The extended rise time (t4−t2) leads to the reduction of the reaction force from the moving element 15 to the vibrator 11 of the vibration wave motor 10 at the start.

In the case of the vibration wave motor 10 with PZT incorporated, the frequency change rate of frequency sweep at the start under [(T/B)÷W]: 0.51 is assumed to be approx. 1 [kHz/msec].

In the case where the value of [(T/B)÷W] is in the range of 0.84 to 1.02, the motion in the driving direction of the drive surfaces 12a is increased approx. 1.6 to 2 times the level under [(T/B)÷W]=0.51. Accordingly, when the rise time (t4−t2) is doubled, that is, when the frequency change rate of frequency sweep is set to approx. a half the value, for example, 0.5 [kHz/msec], the load on the vibration wave motor 10 becomes the equivalent level or lower than the case with PZT incorporated under [(T/B)÷W]: 0.51.

In the case where the value of [(T/B)÷W] is in the range of 1.02 to 1.94, the motion in the driving direction of the drive surfaces 12a is increased approx. 2 to 3.8 times the level under [(T/B)÷W]=0.51. Accordingly, when the rise time (t4−t2) is quadrupled, that is, when the frequency change rate of frequency sweep is set to approx. a quarter the value, for example, 0.25 [kHz/msec], the load on the vibration wave motor 10 becomes the equivalent level or lower than the case with PZT incorporated under [(T/B)÷W]: 0.51.

The change amount in frequency is made to be changed according to the value of [(T/B)÷W], thereby enabling to surely start the vibration wave motor 10 even in the case where the change in speed is large such as when the vibration wave motor 10 is started (that is, in the case where the load on the vibrator 11 of the vibration wave motor 10 is large).

The present embodiment discloses the case of the vibration wave motor 10 using a progressive vibration wave, and nine waves. Even in the case of other numbers of waves, such as four to eight waves or ten waves or more, the vibration wave motor 10 having the same configuration to execute the same control is capable of exhibiting the same effects.

What is claimed is:

1. A lens barrel comprising:
an element configured to be displaced by application of voltage;
an elastic body having a contact surface coming into contact with the element, a drive surface to produce a vibration wave by displacement of the element, and a plurality of grooves;
a moving element configured to come into contact with the drive surface and rotate by the vibration wave;
an annular ring configured to rotate by rotating of the moving element; and
a lens configured to move in a direction of an optical axis by rotating of the annular ring;
wherein the element is made of a material having potassium sodium niobate, potassium niobate, sodium niobate, or barium titanate as a principal component,
wherein a value of [(T/B)÷W] is in a range of 0.84 to 1.94, where T represents a depth of the groove, B represents a distance from a bottom part of the groove to the contact surface, and W represents a radial width of the elastic body.

2. The lens barrel according to claim 1, wherein
the element has a thickness in a direction of a depth of the groove.

3. The lens barrel according to claim 1, wherein
the value of [(T/B)÷W] is in a range of 0.84 to 1.02.

4. The lens barrel according to claim 1, wherein
the value of [(T/B)÷W] is in a range of 1.02 to 1.94.

5. The lens barrel according to claim 1, the lens barrel comprising:
a drive circuit configured to provide a drive signal that fluctuates repeatedly to a vibration wave motor having the element and the elastic body, wherein
when starting the vibration wave motor under a speed zero up to a speed larger than zero, the drive circuit changes a frequency change rate of the drive signal on a basis of the value of [(T/B)÷W].

6. The lens barrel according to claim 5, wherein
the drive circuit is set the frequency change rate to 0.5 kHz/msec or lower when the value of [(T/B)÷W] is in a range of 0.84 to 1.02, and
is set the frequency change rate to 0.25 kHz/msec or lower when the value of [(T/B)÷W] is in a range of 1.02 to 1.94.

7. The lens barrel according to claim 1, wherein
the element is an electromechanical conversion element configured to convert electrical energy to mechanical energy.

8. An imaging device comprising:
the lens barrel according to claim 1; and
a camera body.

* * * * *